United States Patent [19]

Harris et al.

[11] 4,179,661

[45] Dec. 18, 1979

[54] CIRCUIT FOR PROGRAMMING THE SEARCH CIRCUIT OF A RADIO RECEIVER

[75] Inventors: Raymond W. Harris, Rustburg; Ralph R. Sherman, Jr., Forest, both of Va.

[73] Assignee: General Electric Company, Lynchburg, Va.

[21] Appl. No.: 819,862

[22] Filed: Jul. 28, 1977

[51] Int. Cl.² ............................................. H04B 1/32
[52] U.S. Cl. ..................................... 325/455; 325/470
[58] Field of Search ............... 325/334, 335, 453, 459, 325/464, 465, 468–470, 455

[56] References Cited

U.S. PATENT DOCUMENTS

| | | | |
|---|---|---|---|
| 3,651,469 | 3/1972 | Keese | 325/470 |
| 3,794,925 | 2/1974 | Imazeki | 325/470 |
| 3,845,394 | 10/1974 | Hamada | 325/470 |
| 3,968,440 | 7/1976 | Ehni | 325/455 |
| 4,060,768 | 11/1977 | Tanaka | 325/470 |
| 4,061,982 | 12/1977 | Kawashima | 325/464 |
| 4,114,102 | 9/1978 | Denzene | 325/470 |
| 4,123,717 | 10/1978 | Yiu et al. | 325/470 |

*Primary Examiner*—Marc E. Bookbinder
*Attorney, Agent, or Firm*—James J. Williams

[57] ABSTRACT

A circuit that determines which channels of a radio receiver are to be scanned and which channels are to be skipped is programmed or preset by a first switch which selectively energizes an automatic search circuit or a manual channel selector switch and a scan-skip switch. When the channel selector switch is energized, individual channels can be selected. As each channel is selected, a readout circuit provides an indication if the channel has been previously programmed to be scanned, but provides no indication if the channel has been previously programmed to be skipped. Also, each channel selected by the channel selector switch can be programmed for scanning or skipping by the scan-skip switch. The circuit permits a large number of channels to be programmed by only three switches, thus saving space which is limited in very small radio receivers.

8 Claims, 5 Drawing Figures

CIRCUIT FOR PROGRAMMING THE SEARCH CIRCUIT OF A RADIO RECEIVER

CROSS-REFERENCE TO RELATED APPLICATIONS

This application is related to an application entitled "Improved Search Circuit for a Radio Receiver", filed July 28, 1977, Ser. No. 819,863, now U.S. Pat. No. 4,144,499 and assigned to the same assignee as this application.

BACKGROUND OF THE INVENTION

Our invention relates to a circuit for programming the search circuit of a radio receiver, and particularly to such a circuit for programming a large number of channels with a relatively small number of switches.

Search receivers are used extensively to monitor a plurality of radio channels. A typical search receiver includes a circuit that causes the desired channels to be sequentially scanned. If, when scanned, a channel has a signal present, scanning stops until the signal ends. After the signal ends, scanning resumes until another signal is present on a channel when scanned. As far as we are aware, previous search receivers used or required a separate switch for each channel. Each channel switch was selectively positioned for scanning or skipping. However, if the receiver was capable of receiving a large number of channels, sixteen not being unusual, or if the receiver was of the small personal type, the available panel space for the necessary switches limited the number of channels which could be programmed. Further, the large number of switches made a small receiver unattractive or difficult to handle.

Accordingly, a primary object of our invention is to provide a new and improved circuit for programming the search circuit of a radio receiver.

Another object of our invention is to provide a new and improved programming circuit for a search receiver that saves power in its readout circuit.

Another object of our invention is to provide a new and improved circuit that permits a relatively large number of radio channels to be programmed for scanning or for skipping with only three manual switches needed on the receiver panel.

Another object of our invention is to provide a new and improved circuit that permits a relatively large number of radio channels to be programmed for scanning or for skipping but that prevents accidental or undesired programming of a channel.

Where a radio receiver can scan a large number of channels, the user may forget which channels were previously programmed for scanning and which channels were previously programmed for skipping.

Accordingly, another object of our invention is to provide a new and improved circuit that permits a relatively large number of radio channels to be programmed for scanning or for skipping, and that provides a visual indication of which channels were previously programmed to be scanned and which channels were previously programmed to be skipped.

SUMMARY OF THE INVENTION

Briefly, these and other objects are achieved in accordance with our invention by a circuit having a first switch which selectively energizes the circuit for automatic scanning or which energizes a manual channel selector switch and a second programming or scan-skip switch. When the channel selector switch is energized, each receiver channel may be individually selected. When a channel is selected, a readout circuit will provide an indication of whether that channel was previously programmed to be scanned or was programmed to be skipped. Also when a channel is selected, the second programming switch may be operated to cause a memory to program the channel to be scanned or to be skipped. All other channels may be selected, reviewed, and programmed in the same way. The three switches make it possible for a physically small radio to search a large number of channels, each of which can be reviewed and programmed. An intentional change of the programming of our circuit is relatively easy, but an accidental change of the programming of our circuit is very unlikely or difficult.

BRIEF DESCRIPTION OF THE DRAWING

The subject matter which we regard as our invention is particularly pointed out and distinctly claims in the claims. The structure and operation of our invention, together with further objects and advantages, may be better understood from the following description given in connection with the accompanying drawing, in which:

DESCRIPTION OF THE PREFERRED EMBODIMENT

Background

Figure 1:
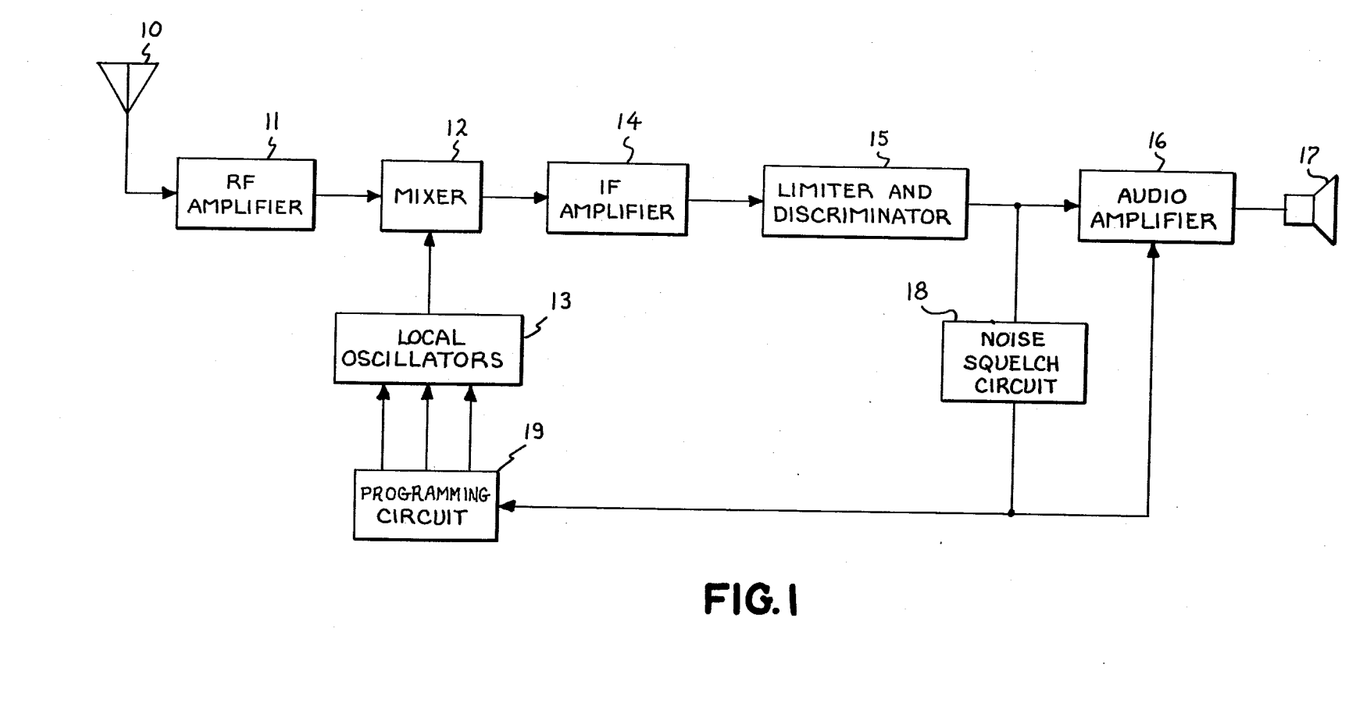
FIG. 1 shows a block diagram of a radio receiver having a programming circuit such as provided by our invention.

FIG. 1 shows a typical, known frequency modulation receiver having a circuit such as provided in accordance with our invention. Such a receiver is provided with an antenna 10 which supplies signals to a radio frequency (RF) amplifier 11. These amplified signals are applied to a mixer 12 which also receives a signal from one of a plurality of local oscillators 13. The frequency derived from the oscillators 13 determines the frequency of reception of the receiver. The mixed signals, usually a difference frequency, are applied to an intermediate frequency (IF) amplifier 14. The amplified signals are then applied to a limiter and discriminator 15 which produces audible signals. The audible signals are supplied to an amplifier 16 and reproduced by any suitable means such as a loudspeaker 17. As known in the art, audible signals from the limiter and discriminator 15 are also supplied to a noise squelch circuit 18. Typically, the noise squelch circuit 18 includes a high pass filter. In the absence of a radio frequency carrier, the filter produces a noise signal which is called a squelch signal. This squelch signal prevents the audio amplifier 16 from passing audio signals. When a radio frequency carrier is received, the noise signals passed by the filter are reduced or disappear, and the filter produces an unsquelch signal. This unsquelch signal permits the amplifier 16 to pass audible signals.

The squelch and unsquelch signals are also applied to a circuit 19. The circuit 19 includes means for producing a sequence of signals to activate a corresponding plurality and sequence of the oscillators 13. In the absence of a received RF signal, the oscillators 13 are activated in sequence, so that the receiver is receptive to each of a plurality of radio frequencies. If, during the time an oscillator is activated, a signal is received on a frequency, the noise squelch circuit 18 produces an unsquelch signal. In addition to its function for the audio amplifier 16, this unsquelch signal stops the search circuit 19 and causes the search circuit 19 to continue to activate the local oscillator corresponding to the frequency of the signal received. The receiver remains on this frequency until the signal terminates, after which, the noise squelch circuit 18 produces a squelch signal that permits the circuit 19 to function again.

The receiver as thus far described is known in the art as a search or scan receiver. While the receiver has been described in connection with frequency modulated signals, the circuit above as well as our invention can also be used with other modulated signals, such as amplitude modulation. The other types of modulation simply require that some indication be given when a signal is received.

Circuit Description

Figure 2:
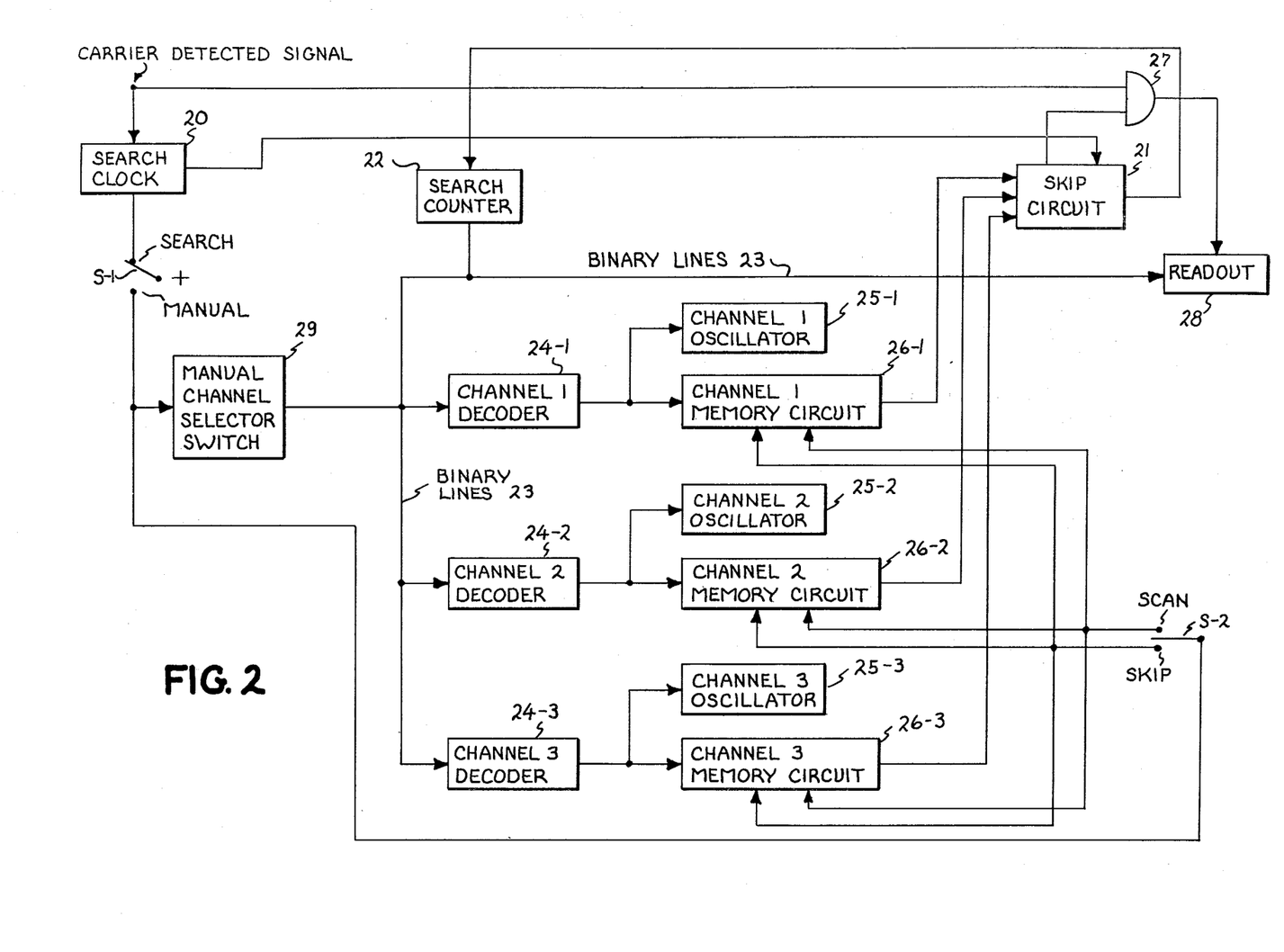
FIG. 2 shows a block diagram of a programming circuit in accordance with our invention which can be used in the receiver of FIG. 1.

FIG. 2 shows a block diagram of a programming circuit in accordance with our invention which can be used for the circuit 19 of FIG. 1. Our circuit uses a number of logic elements, and in this application, we have assumed that a logic 1 is represented by a positive voltage and that a logic 0 is represented by a zero voltage. Other voltage values may be used. In FIG. 2, we have assumed that the receiver is to search or scan three channels. However, any number of channels can be searched or scanned in accordance with our invention. Our programming circuit controls a search circuit having a clock 20 which produces repetitive pulses at a selected rate, for example at a frequency of 25 Hertz. Such pulses would have alternating logic 1 and logic 0 states of 20 milliseconds each. These pulses are applied to a skip circuit 21. The pulses are derived under the control of the skip circuit 21 and applied to a search counter 22. The search counter 22 may include a series of flip-flops or other logic devices that produce binary count signals on two binary lines 23 (shown as a single line for simplicity). Two binary lines permit a binary count from one through four, which is sufficient for the three channels. Five through eight channels would require a third binary line, and nine through sixteen channels would require a fourth binary line. As an example for three channels, the two binary lines 23 could have the signals 01, 10, and 11 in repetitive sequence, changing between each pair of signals in response to each clock pulse received by the search counter 22. If a fourth channel were used, the binary lines 23 could also have the signals 00 in the sequence.

A plurality of channel decoders 24-1, 24-2, 24-3 are coupled to the binary lines 23. The decoders are shown as separate units, but it is to be understood that a single decoder unit with a common input and a plurality of outputs can be used, and is intended to be included by the decoders shown. The decoder outputs produce signals in repetitive sequence. The decoders may include logic gates which pass only a predetermined signal configuration on the binary lines 23 so that only one decoder responds at a time to produce an output signal. Thus, the channel 1 decoder 24-1 responds only to each occurrence of the binary signals 01; the channel 2 decoder 24-2 responds only to each occurrence of the binary signals 10; and the channel 3 decoder 24-3 responds only to each occurrence of the binary signals 11. As each decoder responds to its appropriate signals, it is arranged to produce a logic 1 at its output.

The outputs of the decoders are respectively applied to oscillators 25-1, 25-2, 25-3. When an oscillator receives a logic 1 from its respective decoder, it is activated so as to cause the receiver (of FIG. 1) to be responsive to a radio frequency corresponding to the oscillator frequency. The outputs of the decoders are also respectively applied to memory circuits 26-1, 26-2, 26-3. When a memory circuit is provided with a logic 1 from its respective decoder, the memory circuit can be arranged or preset to scan or skip by momentarily moving a switch S2 (when energized) from its normal disengaged position shown either to its scan contact or to its skip contact. Each of the memory circuits produces a steady logic 1 (i.e. blocks its decoder signal) at its output if its memory has been arranged for scanning by the energized switch S2. However, if a memory circuit has been arranged by the energized switch S2 to skip its respective channel, it produces a logic 1 when its respective decoder is not responsive, and produces a logic 0 when its respective channel decoder is responsive.

The outputs of the memory circuits are respectively applied to memory inputs of the skip circuit 21 to control the skip circuit 21. When the search counter 22 produces logic signals on the binary lines 23 corresponding to the time of scanning of a given channel, if that given channel is to be scanned, the inputs to the skip circuit 21 permit the pulse from the clock 20 to pass through the search counter 22 without modification. However, if at that time the given channel is to be skipped, the skip circuit 21 produces an additional pulse which causes the search counter 22 to change the outputs on the binary lines 23 to the next sequence. Thus, the channel which was to have been scanned is rapidly skipped, and the next decoder in the sequence can respond to produce an appropriate signal on the binary lines 23.

If a signal is received on the channel being scanned, a logic 1 carrier detected signal (which may be the unsquelch signal from the noise squelch circuit 18 of FIG. 1) is produced. This signal is applied to the search clock 20 to stop the search clock for the duration of the received signal. Searching is stopped until the received signal ends, after which the search clock 20 is permitted to run again. During the time that a given channel is scanned, the skip circuit 21 produces a logic 1 which is applied to an AND gate 27. If the carrier detected signal (assumed to be a logic 1) is provided at this time, the AND gate 27 produces a logic 1 which enables an indicator or readout circuit 28. And as will be explained in more detail, the readout circuit will only be enabled for those channels preset to be scanned during automatic searching or during manual selection. This saves power, which is important when supplied by a battery. During the time that the readout circuit 28 is enabled or energized, it provides a suitable indication of the logic signals on the binary lines 23. The readout circuit 28 may be any suitable device, such as a seven segment numerical device, lamps, or any device that is known in the art.

A switch S1 is provided for automatic searching or for manual searching and programming. The arm of the switch S1 is energized by a suitable voltage. When the switch S1 is in the upper position as shown in FIG. 2, this voltage is applied to operate the search clock 20. When the switch S1 is in the lower position, the clock 20 is disabled, and a manual channel selector switch 29 and a programming switch S2 are rendered operable or energized. The switch 29 may be a rotary switch having a plurality of positions (which can be indicated on a panel), each of which causes the energized switch 29 to produce predetermined binary signals. In other words the switch 29 manually supplies the same signals as the search counter 22. When the manual channel selector switch 29 is made operable, a user may position or rotate the switch 29 to provide the appropriate binary signals on the lines 23 corresponding to the channel numbers. For the assumed example, when the switch 29 is in the position for channel 1, the binary lines 23 have the logic signals 01. When the switch 29 is in the position for channel 2, the binary lines 23 have the signals 10; and when the switch 29 is in the position for channel 3, the lines 23 have the signals 11. These signals are applied to the decoders 24-1, 24-2, 24-3 and to the readout 28 to cause the decoders to produce the respective channel signal. If a carrier detected signal is produced (by unsquelching the receiver), the readout 28 can produce the respective channel indication. When the switch S2 is made operable, it can program the memory (corresponding to the manually selected channel) for scanning or skipping.

Figure 3:
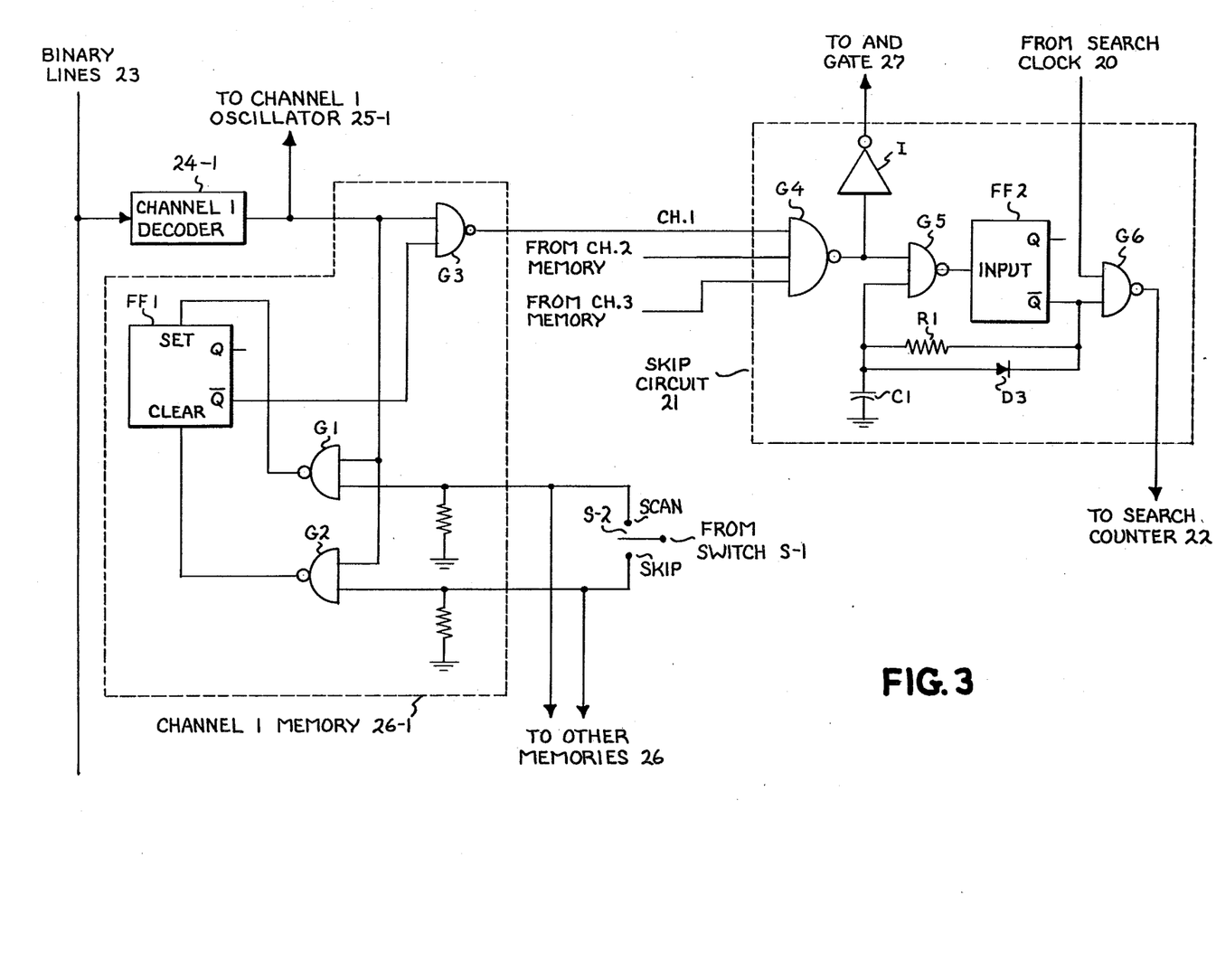
FIG. 3 shows a more detailed diagram of the memory circuit and the skip circuit of FIG. 2.

In FIG. 2, the search clock 20, the search counter 22, the manual selector switch 29, the decoders 24-1, 24-2, 24-3, the oscillators 25-1, 25-2, 25-3, and the readout circuit 28 are devices known in the art. Hence, it is believed that the block diagram for these circuit elements is sufficient. However, we believe our memory circuits 26-1, 26-2, 26-3 and our skip circuit 21 are new, so that we show the memory 26-1 for channel 1 and the skip circuit 21 in more detailed form in FIG. 3. The memory circuits for channels 2 and 3 would be similar. FIG. 3 utilizes a number of NAND gates, such as a two input NAND gate G1 and a three input NAND gate G4. As known in the art, if any input to a NAND gate is at a logic 0, the NAND gate produces a logic 1 at its output. If all inputs of a NAND gate are at a logic 1, then the NAND gate produces a logic 0. The memory circuit of FIG. 3 uses a bistable flip-flop FF1 whose set input, clear input, and $\overline{Q}$ output are used. The flip-flop FF1 is set by applying a logic 0 to its set input to cause the $\overline{Q}$ output to provide a logic 0. The flip-flop FF1 is cleared by applying a logic 0 to its clear input to cause the $\overline{Q}$ output to provide a logic 1. A monostable flip-flop FF2 is used in the skip circuit 21. In its normal stable condition, the flip-flop FF2 produces a logic 1 at its $\overline{Q}$ output. The flip-flop FF2 may be triggered to its unstable condition (for a selected predetermined time depending upon its timing components) by applying a logic 0 to its input. Upon receipt of this logic 0 trigger, the $\overline{Q}$ output produces a logic 0 for the predetermined time, and then returns to its normal stable logic 1. The $\overline{Q}$ output of the flip-flop FF2 is fed back to the gate G5 through a diode D3 for a logic 0, or through a timing resistor R1 and capacitor C1 for a logic 1. While we have shown only the one memory circuit 26-1, it is to be understood that the other memory circuits (the number depending upon the number of channels) may have the same configuration.

Programming Operation

The programming operation of our circuit will be explained for channel 1 in connection with FIGS. 2 and 3. First, the switch S1 is positioned to engage its manual contact and energize the selector switch 29 and the programming switch S2. The receiver is unsquelched so that a carrier detected signal is provided. The selector switch 29 is then rotated or moved to its channel 1 position. This causes the binary lines 23 to have the logic signals for channel 1, namely 01. The channel 1 decoder 24-1 output switches from a logic 0 to a logic 1. This logic 1 causes a NAND gate G3 to produce a logic output determined by the memory input supplied from the $\overline{Q}$ output of the flip-flop FF1. The flip-flop FF1 is set or cleared depending upon the outputs of the NAND gates G1, G2. One input of the gate G1 is connected to the scan terminal of the programming switch S2, and one input of the gate G2 is connected to the skip terminal of the switch S2. The other inputs of the gates G1, G2 are connected to the decoder 24-1 for causing the gates G1, G2 to be responsive to the switch S2 when a decoder signal (logic 1) is present and when the switch S2 is energized by the switch S1. With channel 1 selected by the energized manual switch 29, the channel 1 decoder 26-1 produces a steady logic 1. If the switch S2 is operated to its scan position, this applies a logic 1 to the input of the gate G1. Both inputs to the gate G1 are at a logic 1 so that the gate G1 produces a logic 0 to set the flip-flop FF1. This causes the $\overline{Q}$ output to produce a logic 0 so that the gate G3 produces a steady scan (logic 1) signal. Thus changes in the channel 1 decoder 24-1 output are blocked by the gate G3 for a scan condition. At this point in time, all inputs to the gate G4 are at logic 1 so that the gate G4 produces a logic 0. This is inverted to a logic 1 by a logic inverter I and applied to the AND gate 27 (in FIG. 2). If the receiver is made to produce an unsquelch logic 1 signal, the AND gate 27 produces a logic 1 so that the readout circuit 28 is enabled and a visual indication given of the channel that is preset to be scanned. If the energized switch S2 is operated to the skip position, both inputs to the gate G2 are logic 1. The flip-flop FF1 is cleared and the $\overline{Q}$ output produces a logic 1. This permits the gate G3 to produce a logic 0 when the decoder 24-1 produces a logic 1, and to produce a logic 1 when the decoder 24-1 produces a logic 0. In other words, the decoder outputs are passed by the gate G3 for a skip condition. At this time when the gate G3 produces a logic 0, this causes the gate G4 to produce a logic 1. This is inverted to a logic 0 by the inverter I so that the AND gate 27 produces a logic 0 and the readout circuit 28 is not enabled. Hence no visual indication is given for a channel that is preset to be skipped. The other memory circuits of FIG. 2 are arranged or programmed in the same manner. The switch 29 is positioned for each channel, and while it is so positioned, the switch S2 operated to the scan or skip contact as desired. Thus substantially any number of channels can be programmed by the three switches S1, 29, S2. And in view of the sequence involved in our programming circuit, accidental programming, such as by dropping or hitting the receiver, is almost impossible. With the receiver unsquelched, a user can easily review the previous programming of the channels by moving the energized switch 29 to each channel position and observing the readout circuit 28. As the review is made, readout power is saved for those channels programmed to be skipped, since no visual indication is given for those channels. If a channel is manually selected to be received, readout power is also saved as visual indication is provided only when the receiver is unsquelched by receipt of a carrier signal.

Circuit Operation

The output from the gate G3 is applied to the channel 1 input of the gate G4 in the skip circuit 21. Similar outputs from the other channel memory circuits are applied to the other inputs of the gate G4. The output of the gate G4 is applied to one input of a NAND gate G5. If all inputs to the gate G4 are at a logic 1, (as they would be for a channel to be scanned), the gate G4 produces a logic 0 at its output. This logic 0 at one input of the gate G5 causes a logic 1 to be applied to the input of the flip-flop FF2. This has no effect on the flip-flop FF2. However, if a channel is to be skipped, one of the inputs to the gate G4 switches to a logic 0 when that channel decoder produces a logic 1. This logic 0 causes the gate G4 to produce a logic 1 which is applied to the gate G5. The $\overline{Q}$ output of the flip-flop FF2 is also at a logic 1 and is applied to the gate G5 so that gate G5 produces a logic 0 that causes switching of the flip-flop FF2 for a predetermined time. This switching causes the $\overline{Q}$ output of the flip-flop FF2 to switch to a logic 0 which causes the gate G6 to produce a logic 1 at its output for the time duration that the flip-flop FF2 is in its switched or unstable state. After the timed duration, the $\overline{Q}$ output returns to a logic 1. The gate G6 produces a logic 0 which is applied to the search counter 22 to add one more pulse or signal to the counter 22. This causes the counter 22 to produce another count so that the binary lines 23 switch to their next logic state as though another pulse from the search clock 20 had been received. The pulse produced by the flip-flop FF2 is very rapid, in the order of 50 microseconds for example, so that the added pulse is received very quickly to cause the search counter 22 to switch to its next count condition. Thus, skipping is achieved very quickly without any interruption or indication in a radio receiver. This is emphasized by the fact that the short duration (in the order of microseconds) of the added pulse is very small compared to the relatively long duration (for example 40 milliseconds) between leading edges of the clock pulses.

Figure 4:
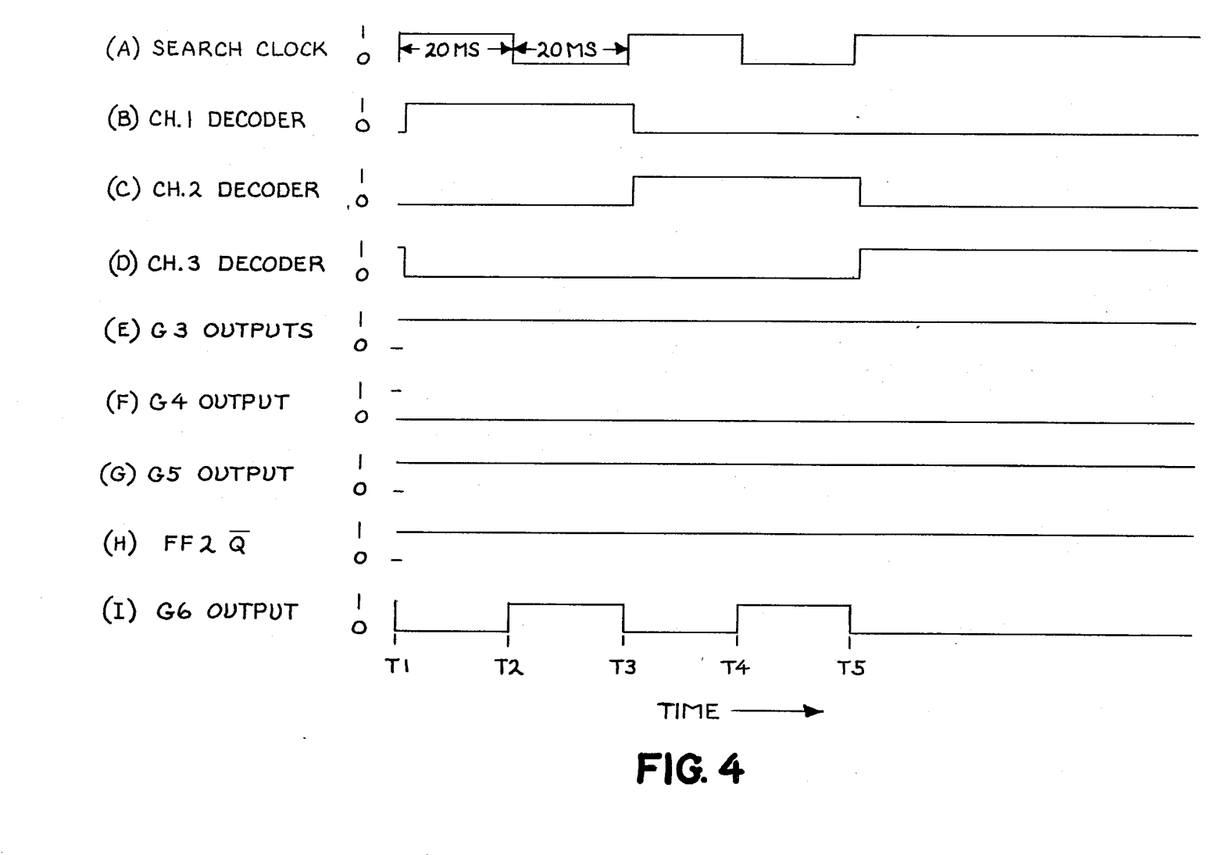
FIGS. 4 and 5 show waveforms for illustrating the operation of our circuit of FIGS. 2 and 3.

Our circuit of FIGS. 2 and 3 is further explained in connection with the waveforms of FIGS. 4 and 5. For FIG. 4, we have assumed that the switch S1 was placed in its manual position, the receiver was made to produce an unsquelch (logic 1) signal, the selector switch 29 moved to each of the three channel positions, and the switch S2 moved to the scan position for each selected channel to preset the three memories for scanning. Thus, any number of channels can be preset or programmed by only three switches. And as the switch S2 was moved to the scan position for each channel, a visual indication was given by the circuit 28. After the memories are preset, the switch S1 is moved to the search position. The waveforms of FIG. 4 are plotted along a common time axis. FIG. 4A shows the pulses provided by the search clock 20, and we have assumed that the search clock varies between logic 0 and logic 1 for equal 20 millisecond periods. At the time T1, the search clock goes from a logic 0 to a logic 1. This causes the gate G6 to produce a logic 0 as shown in FIG. 4I. We have assumed that the binary lines 23 switch to the signals 01 at this time T1. Shortly after the time T1, the channel 1 decoder switches from a logic 0 to a logic 1 as shown in FIG. 4B. At about the same time the channel 3 decoder, which had been previously activated, switches from a logic 1 to a logic 0. The channel 2 decoder and the channel 3 decoder outputs are at a logic 0 as shown in FIGS. 4C and 4D. With all channels programmed or arranged to be scanned, each of their respective flip-flips FF1 in their memory circuits produce a logic 0 at the $\overline{Q}$ output. Hence, all gates G3 produce a steady logic 1 at their output as shown in FIG. 4E. With all gates G3 producing a logic 1, all inputs to the skip circuit gate G4 are at a logic 1, so that the gate G4 produces a logic 0 at its output as shown in FIG. 4F. This causes the gate G5 to produce a logic 1 as shown in FIG. 4G. The flip-flop FF2 is in its normal condition with the $\overline{Q}$ output at a logic 1 as shown in FIG. 4H. Since the $\overline{Q}$ output is at a logic 1, the search clock applied to the other input of the gate G6 causes the gate G6 to follow the search clock as shown in FIG. 4I. At the time T2, the search clock switches from a logic 1 to a logic 0, and this causes the gate G6 to switch from a logic 0 to a logic 1. Nothing further happens until the time T3 when the search clock switches from a logic 0 back to a logic 1. Shortly after this, the search counter 22 produces a different output so that the binary lines 23 have the signals 10. This causes the channel 1 decoder to switch from a logic 1 to a logic 0 and the channel 2 decoder to switch from a logic 0 to a logic 1. Nothing further happens until the time T4 when the search clock switches back to a logic 0, causing the gate G6 to switch to a logic 1. At the time T5, the search clock again switches from a logic 0 to a logic 1, the gate G6 produces a logic 0, and this causes the binary lines 23 to have the signals 11. The channel 1 decoder does not respond to this, and the channel 2 decoder switches back from a logic 1 to a logic 0. The channel 3 decoder switches from a logic 0 to a logic 1.

After the time T5, and while the channel 3 decoder produces a signal to activate the channel 3 oscillator, we have assumed that a signal is received by the receiver on channel 3. This signal causes the search clock 20 to stop switching or producing pulses, so that even though the gate G6 will pass pulses, the pulses at its output remain at a logic 0 as shown in FIG. 4I after the time T5. The circuit remains stable during the time that the signal is received. During this time, the gate G4 is producing a logic 0 which is inverted by the inverter I to a logic 1. This logic 1, along with the carrier detected or unsquelch signal (logic 1) is applied to the AND gate 27 to produce a logic 1 that enables the readout circuit 28. With the readout circuit 28 activated, and the binary lines 23 supplying the signals 11, the readout circuit 28 provides an indication of channel 3. This indication may be in any form desired, such as the seven segment readout device mentioned earlier.

When the signal on channel 3 terminates, the carrier detected signal returns to a logic 0 which enables the search clock 20 to begin producing pulses once again. Thereafter, the operation continues as shown in FIG. 4 until another signal is received.

Figure 5:
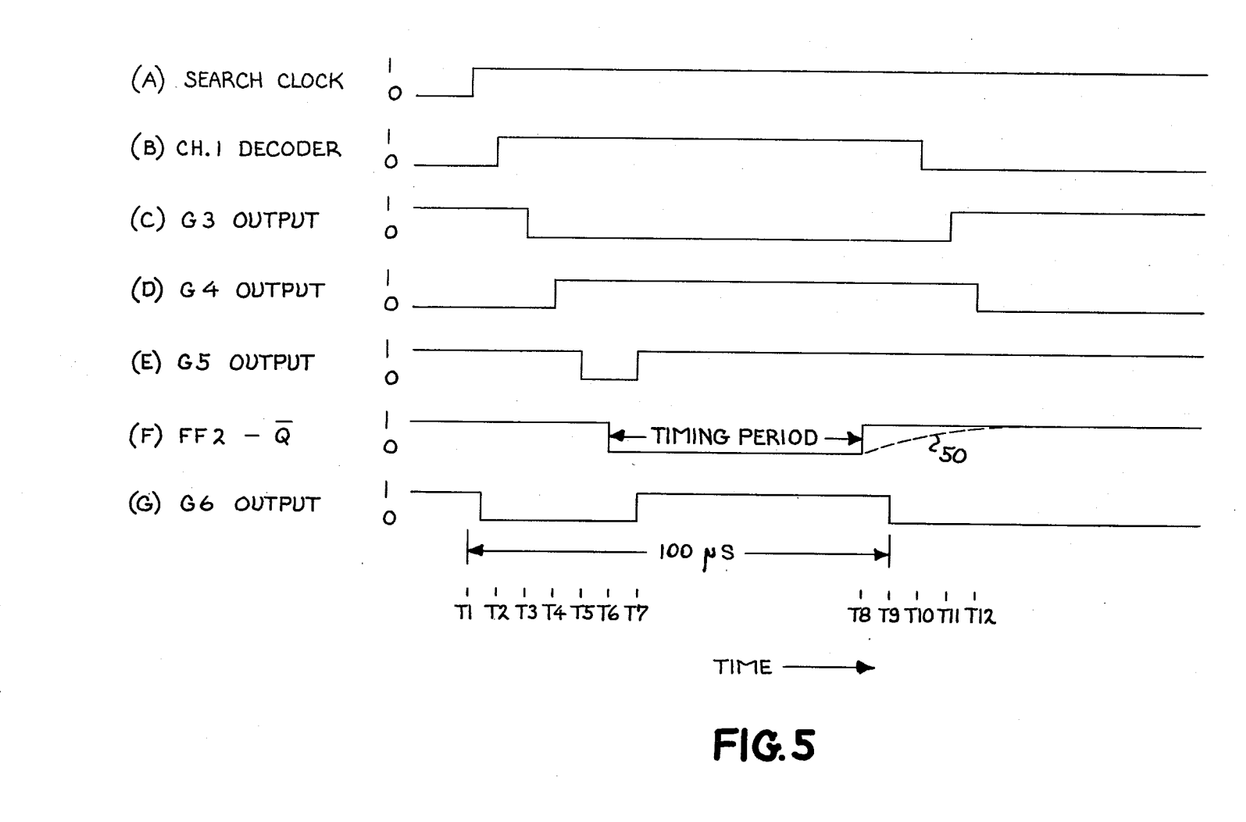

FIG. 5 shows a group of waveforms plotted along a common time axis for illustrating the operation of our search circuit when channel 1, for example, is to be skipped, and channels 2 and 3 are to be scanned. The waveforms of FIG. 5 are plotted along a greatly enlarged time axis. For example, in FIG. 5 the time from the time T1 to the time T9 is only about 100 microseconds as opposed to the 20 milliseconds illustrated in FIG. 4. When a channel is to be skipped, the switch S1 is connected to its manual contact to enable the manual switch 29, and the manual switch 29 is then positioned to the channel to be skipped, namely channel 1. This causes the binary lines 23 to have the signals 01, which are decoded by the channel 1 decoder 24-1. This causes the readout circuit 28 to indicate channel 1 if channel 1 had been previously preset to be scanned. With the channel 1 decoder producing a logic 1, the switch S2 is momentarily pushed to its skip position and this provides the gate G2 with two logic 1's. The gate G2 produces a logic 0 which clears the flip-flop FF1 so that the $\overline{Q}$ output is at a logic 1. This enables the gate G3 to produce outputs which follow the channel 1 decoder signals. While the switch 29 is set on channel 1, the decoder 24-1 and the $\overline{Q}$ output are both logic 1. The gate G3 produces a logic 0 so that the gate G4 produces a logic 1. The inverter I changes this logic 1 to a logic 0 which causes the AND gate 27 to produce a logic 0 that disables or turns off the readout circuit 28. This indicates that channel 1 is preset to be skipped. Channels 2 and 3 are arranged for scanning, and this is done by first setting the manual selector switch for channel 2 and then moving the switch S2 to the scan position. This sets the flip-flop FF1 so that the $\overline{Q}$ output is at a logic 0 that causes the gate G3 for channel 2 to produce a steady logic 1. All inputs to the gate G4 are at logic 1 so that the gate G4 produces a logic 0. This is inverted to a logic 1 by the inverter I so that the AND gate 27 (which also has a logic 1 unsquelch signal) produces a logic 1 that enables the readout circuit 28. This indicates that channel 2 is preset to be scanned. The same operation is then performed for channel 3. This conditiion can be summarized by the following table:

| Receiver | Memory Inputs to G4 | | | G4 | Inverter | Readout. |
|---|---|---|---|---|---|---|
| Tuned | Skip 1 | Scan 2 | Scan 3 | Output | Output | Circuit |
| Channel 1 | 0 | 1 | 1 | 1 | 0 | Disabled |
| Channel 2 | 1 | 1 | 1 | 0 | 1 | Enabled |
| Channel 3 | 1 | 1 | 1 | 0 | 1 | Enabled |

With channel 1 arranged for skipping and channels 2 and 3 arranged for scanning, the switch S1 is then returned to its search position. The receiver is set for normal squelch. The search clock 20 then begins to produce pulses as shown in FIG. 4A. In FIG. 5A, we have assumed that at the time T1 the search clock produces a pulse of logic 1. The $\overline{Q}$ output of the flip-flop FF2 is at a logic 1, so that when the search clock switches to a logic 1, the gate G6 produces a logic 0 shortly after the time T1 as shown in FIG. 5G. This logic 0 causes the search counter 22 to produce the 01 signals on the binary lines 23. At the time T2, the channel 1 decoder responds to this condition and produces a logic 1 as shown in FIG. 5B. Since the $\overline{Q}$ output of flip-flop FF1 for channel 1 is already at a logic 1, the gate G3 then produces a logic 0 as shown in FIG. 5C at the time T3. The inputs to the gate G4 for channels 2 and 3 are at a steady logic 1 signifying both channels are to be scanned. But when the output of the gate G3 goes to a logic 0, this causes the gate G4 to produce a logic 1 at the time T4 as shown in FIG. 5D.

When the gate G4 produces a logic 1, this logic 1 is inverted to a logic 0 to disable the AND gate 27. This logic 1 and the logic 1 from the $\overline{Q}$ output of the flip-flop FF2 cause the gate G5 to produce a logic 0 as shown in FIG. 5E at the time T5. This logic 0 causes the flip-flop FF2 to change to its unstable state beginning at the time T6 as shown in FIG. 5F. The $\overline{Q}$ output switches to a logic 0 which causes the gate G6 to produce a logic 1 at the time T7. The $\overline{Q}$ output is also fed back through the diode D3 without delay to the input of the gate G5. This causes the gate G5 to produce a logic 1 at the time T7.

Summarizing the action to this point, the search clock produced the pulse calling for channel 1 to be scanned. However, the gate G6 produced the needed pulse shortly after the time T1 but only until the time T7, a period much too short for the receiver to respond to a carrier and produce a carrier detected signal. At the time T7, the output of the gate G6 returns to a logic 1. The next action to take place is the end of the timing period of the flip-flop FF2 at the time T8. When this occurs, the $\overline{Q}$ output switches to a logic 1 as shown in FIG. 5F. This logic 1 (assumed positive) cannot pass through the diode D3 so that the capacitor C1 begins to receive a charge through the resistor R1 as indicated by the dashed line 50 in FIG. 5F. This provides a delay that keeps the input to the gate G5 at a logic 0 sufficiently long for the gate G4 to produce a logic 0 as will be explained. The $\overline{Q}$ of logic 1 (with the clock puses the gate G6 to produce another logic 0 at the time T9. This provides another count pulse to the count 22 which then produces the next count at its output, which for channel 2 would be the signals 10. The channel 1 decoder switches back to a logic 0 at the time T10. This causes the gate G3 to produce a logic 1 as shown at the time T11. At this time, all inputs to the gate G4 are again at a logic 1 so that the gate G4 produces a logic 0 at the time T12. This logic 0 occurs before the other input to the gate G5 (derived from the $\overline{Q}$ output of the flip-flop FF2) reaches a logic 1. Otherwise, the flip-flop FF2 would be triggered to its unstable or timing state again. The needed time is provided by the fact that the capacitor C1 must be charged through the resistor R1 from the $\overline{Q}$ output, and the time constant of this circuit is arranged so that the input for the gate G5 (derived from the $\overline{Q}$ output) does not reach a logic 1 level until after the output of the gate G4 switches to a logic 0.

In summary, when a channel is skipped, our skip circuit 21 provides an additional skip pulse, in the example of FIG. 5 this pulse being provided at the time T9 when the output of the gate G6 goes to a logic 0 for the second time following a clock pulse. In the example just given, the logic 0 produced by the gate G6 after the time T1 caused the channel 1 decoder to be activated. The logic 0 produced by the gate G6 at the time T9 deactivated the channel 1 decoder and activated the channel 2 decoder. If channel 2 were to be skipped, a similar operation in the channel 2 memory and in the skip circuit would take place. And again, it should be noted that this operation is very rapid or high speed, requiring only approximately 100 microseconds for a skipping as opposed to the milliseconds of time for a normal scan. Thus, 10 channels could easily be skipped, since such skipping would only require 10 times 100 microseconds or 1 millisecond. This is far less than the normal millisecond scanning period. And it is so rapid, that the receiver does not have an opportunity to respond to a signal on the channel, since the receiver would be activated for a time period much less than is needed for activation of the various circuits and production of the carrier detected signal.

It will thus be seen that we have provided a new and improved circuit for programming the search circuit of a radio receiver. Our programming circuit includes only three switches to control a memory circuit for each channel. The memory circuits can be easily preset or programmed from the common switch S2 and the manual switch 29. Our readout circuit permits previous programming to be determined. While we have shown only one embodiment of our invention, persons skilled in the art will appreciate the modifications that can be made. For example, our programming circuit can be provided for almost any number of channels. The switches may take various forms, although we prefer mechanical switches. Other types of memory circuits, decoder circuits, and readout circuits may be utilized. The readout circuit may be omitted, although it is helpful, and does not use much power. Our circuit can also be used in receivers where a priority channel is arranged to always be scanned at selected times or intervals. Logic gates may be added so that programming skips or scans requires the receiver squelch to be open (speaker alive) before selection can be made. This would make accidental bumping of the scan-skip switch S2 (while the unit is in the manual mode) less likely to change the scan sequence. A timing means may be added to extinguish the indicator after a period of time (say 1-2 seconds) after it is turned on to further reduce the current drain of the receiver. The display current is significant and may double the current drain of the unit during long periods of receive. Therefore, while we have described our invention with reference to a particular embodiment, it is to be understood that modifications may be made without departing from the spirit of the invention or from the scope of the claims.

What we claim as new and desire to secure by Letters Patent of the United States is:

1. An improved circuit for selectively programming a search circuit of a radio receiver comprising:
    a. a first manual switch for energizing said search circuit in one state and for energizing said improved circuit in a second state;
    b. channel decoder means connected to said search circuit;
    c. a manual channel selector switch connected between said first switch and said channel decoder means, said manual channel selector switch being energized in response to said first switch being in said second state, and said manual channel selector switch having a plurality of positions, each of which produces a distinct predetermined channel signal;
    d. memory means connected to said decoder means and to said search circuit;
    e. and a second manual switch connected between said first switch and said memory means, said second manual switch being energized in response to said first switch being in said second state, and said second manual switch having a scan state and a skip state for selectively programming said memory means in response to said memory means being activated by a respective channel signal.

2. The improved circuit of claim 1 and further comprising a readout circuit connected to said channel selector switch for providing an indication of the channel selected.

3. The improved circuit of claim 1 and further comprising a readout circuit connected to said channel selector switch for providing an indication of the channel selected, and control means responsive to said memory means for enabling said readout circuit to provide said indication only in response to the combination of a selected memory means being activated by its respective channel signal and said activated memory means being programmed to scan.

4. An improved circuit for a radio receiver search means for presetting memory circuits to cause selected channels to be scanned and selected channels to be skipped by said search means, said improved circuit comprising:
    a. a first manual switch for alternately energizing said radio receiver search means or input means for said improved circuit;
    b. a channel decoder for producing a distinct predetermined channel signal for each of said channels;
    c. a manually operated channel selector switch connected to said input means for energization by said first switch, said channel selector switch having a plurality of positions and an output connected to said channel decoder for causing said channel decoder to produce a distinct predetermined channel signal in response to each selected position;
    d. means for connecting said channel decoder to each of said memory circuits for activating a respective one of said memory circuits in response to a predetermined respective channel signal;
    e. a second manual switch connected to said input means for energization by said first switch;
    f. and means for connecting said second switch to each of said memory circuits for selectively storing a scan condition or a skip condition in each memory circuit activated by its respective channel signal.

5. The improved programming circuit of claim 4 and further comprising a readout circuit connected to said channel selector switch for providing an indication of the channel selected.

6. The improved programming circuit of claim 4 and further comprising a readout circuit connected to said channel selector switch for providing an indication of the channel selected, and control means responsive to said memory circuits for enabling said readout circuit to provide said indication in response to a memory circuit having a stored scan condition and being activated by its respective channel signal.

7. The improved programming circuit of claim 4 and further comprising a readout circuit connected to said channel selector switch for providing an indication of the channel selected; and control means responsive to said memory circuits for enabling said readout circuit to provide said indication only in response to the combined conditions of: a memory circuit being activated by its respective channel signal, said activated memory circuit being programmed to scan, and a carrier detected signal produced by said radio receiver.

8. An improved radio receiver for scanning and skipping selected radio frequency channels in sequence comprising:
    a. switchable oscillator means connected to said radio receiver;
    b. channel scanning means connected to said switchable oscillator means for switching the frequency of said oscillator means and causing said receiver to be receptive to a plurality of radio frequency channels;
    c. and an improved programming circuit connected to said channel scanning means for causing said receiver to scan and skip selected ones of said radio frequency channels comprising:
        1. a first switch having a first contact for energizing said channel scanning means when said first switch engages said first contact and having a second contact for energizing said programming means when said first switch engages said second contact;
2. manual channel selector means connected to said second contact of said first switch and to said channel scanning means for supplying a distinct predetermined channel signal to said channel scanning means in each of a plurality of positions when energized by said first switch;
3. a plurality of memory means connected to said channel scanning means, each of said memory means being activated in response to a respective predetermined channel signal;
4. a second switch connected to said second contact of said first switch and connected to each of said memory means for selectively causing each of said memory means to produce a scan signal or a skip signal when said second switch is energized by said first switch and when each of said memory means is activated by its respective predetermined channel signal;
5. readout means connected to said manual channel selector means for producing an indication of the channel signal produced by said manual channel selector means; and
6. control means connected to each of said memory means and to said readout means for activating said readout means to provide an indication of the channel signal when the activated memory means produces a scan signal, and to block said readout means when the activated memory means produces a skip signal.

* * * * *

UNITED STATES PATENT AND TRADEMARK OFFICE
CERTIFICATE OF CORRECTION

PATENT NO. : 4,179,661
DATED : December 18, 1979
INVENTOR(S) : Raymond W. Harris et al.

It is certified that error appears in the above—identified patent and that said Letters Patent is hereby corrected as shown below:

Column 10, line 56, after "normal" insert -- 40 --.

Signed and Sealed this

Fourth Day of November 1980

[SEAL]

Attest:

SIDNEY A. DIAMOND

Attesting Officer    Commissioner of Patents and Trademarks